(12) United States Patent
Wang

(10) Patent No.: US 10,041,981 B2
(45) Date of Patent: Aug. 7, 2018

(54) CAPACITOR SENSING SYSTEM

(71) Applicant: Silicon Laboratories Inc., Austin, TX (US)

(72) Inventor: Xiaodong Wang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 159 days.

(21) Appl. No.: 14/927,959

(22) Filed: Oct. 30, 2015

(65) Prior Publication Data

US 2017/0122986 A1 May 4, 2017

(51) Int. Cl.
*G01R 27/26* (2006.01)
*G01R 17/02* (2006.01)

(52) U.S. Cl.
CPC ......... *G01R 17/02* (2013.01); *G01R 27/2605* (2013.01)

(58) Field of Classification Search
CPC .............................. G01R 31/2827; H01C 7/12
USPC ........................................ 324/500, 537, 549
See application file for complete search history.

(56) References Cited

U.S. PATENT DOCUMENTS

| 2009/0108914 A1* | 4/2009 | Zhang | H03K 17/962 327/517 |
| 2010/0073799 A1* | 3/2010 | Ionescu | G11B 5/40 360/46 |
| 2012/0185723 A1* | 7/2012 | Jaffar | G06F 11/0745 714/5.1 |
| 2014/0347768 A1* | 11/2014 | Batko | G01R 31/025 361/42 |
| 2016/0178691 A1* | 6/2016 | Simonin | G01R 31/2827 361/42 |
| 2016/0329703 A1* | 11/2016 | Chawgo | H02H 3/05 |

* cited by examiner

*Primary Examiner* — Giovanni Astacio-Oquendo
(74) *Attorney, Agent, or Firm* — Zagorin Cave LLP

(57) ABSTRACT

A capacitor sense system includes a pad for coupling to an external capacitor. A current digital to analog converter (DAC) supplies current to charge the external capacitor. A reference capacitor is charged by a current source. A first comparator compares a voltage across the external capacitor sensed at the pad to a reference voltage and generates a first comparison. A second comparator compares a voltage across a reference capacitor to the reference voltage and generates a second comparison. The stored first and second comparisons are used to control the current DAC. First and second AC coupling capacitors are coupled respectively between the pad and the first comparator and between the reference capacitor and the second comparator. Sensing at the pad allows more accuracy and the AC coupling capacitors provide better matching and allow for different DC biases to be set for the external capacitor and the first comparator.

20 Claims, 3 Drawing Sheets

US 10,041,981 B2

CAPACITOR SENSING SYSTEM

BACKGROUND

Field of the Invention

This application relates to sensors and more particularly to a capacitor sensing system.

Description of the Related Art

Capacitive sensors are used for sensing a variety of physical quantities, e.g., touch. The change in capacitance caused by a touch on a touch screen may be used to determine information regarding the touch. As the use of capacitive sensors continues to expand, improvements in the accuracy of such sensors is desirable.

SUMMARY OF EMBODIMENTS OF THE INVENTION

Accordingly, in one embodiment an apparatus includes a pad for coupling to an external capacitor. A first current source is coupled to the pad through a first path and supplies current to charge the external capacitor. A second path couples a comparator to the pad. The comparator compares a first voltage at the pad corresponding to a voltage across the external capacitor and a predetermined voltage and supplies a first compare indication indicative of the comparison.

In another embodiment, a method is provided for sensing an external capacitor that includes supplying a charging current from a first current source to a pad of an integrated circuit through a first path to charge the external capacitor coupled to the pad. A first voltage across the external capacitor is sensed at the pad and supplied over a second path that is separate from the first path, to a comparator. The comparator compares the first voltage and a reference voltage and provides a compare result indicative of a difference between the first voltage and the reference voltage.

In another embodiment, an apparatus includes a plurality of pads for coupling to respective external capacitors. A current digital to analog converter (DAC) selectively is coupled to one or more of the pads through a first plurality of switches. A first comparator has a first input selectively coupled to the pads through a second plurality of switches and has a second input coupled to a reference voltage. The first comparator compares a first voltage on the first input to the reference voltage and supplies a first compare indication. A second comparator is coupled to compare a second voltage across a reference capacitor and the reference voltage and to supply a second compare indication. A first capacitor is coupled in series between the pads and the first input of the first comparator. A second capacitor is coupled in series between the reference capacitor and the second comparator. A storage circuit stores the first compare indication responsive to the second compare indication indicating the second voltage has reached the reference voltage. An output of the storage circuit is coupled to a control circuit for the current DAC.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments described herein provide an efficient way to improve the rejection of several error sources in the external capacitor charging path in a capacitor sensing system. The external capacitor charging path has several error sources due to its large variation of capacitor values and due to the total resistance from switches and long routing. Embodiments include one or both of Kelvin sensing and AC coupling in the front-end, to improve the accuracy and flexibility of a capacitor sensing system.

Figure 1:
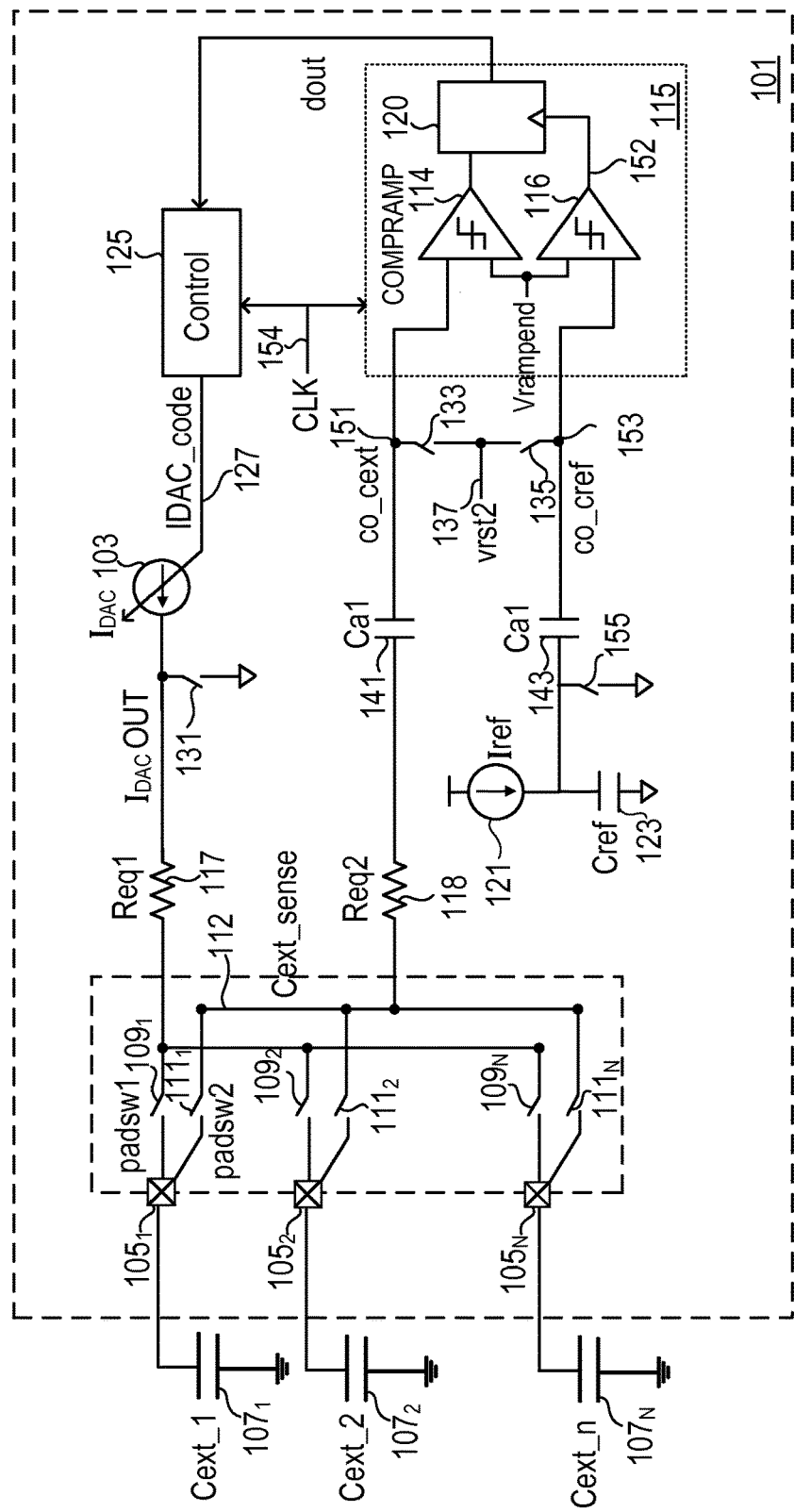
FIG. 1 illustrates a block diagram of capacitive sensing system according to an embodiment.

Referring to FIG. 1, a block diagram illustrates a capacitive sensing system according to an embodiment that includes both Kelvin sensing and AC coupling. The sensing system is formed on integrated circuit 101. A current digital to analog converter (DAC) 103 supplies current $I_{DAC}$ to pad $105_1$, which in turn is coupled to an external capacitor $107_1$. The pads 105 ($105_1$-$105_N$) provide an electrical connection between internal signals and external signals. The path from current DAC 103 to the pad $105_1$ includes resistance associated with the routing and switch $109_1$. The total equivalent resistance from the current DAC 103 to pad $105_1$ is shown as the equivalent resistance (Req1) 117.

The comparator circuit 115 includes comparators 114 and 116 and a storage element (such as a flip-flop) 120. A second switch $111_1$ couples the pad through a separate path to a first input of the comparator 114. The comparator 114 compares the voltage at one input, corresponding to the external capacitance $107_1$, to a predetermined reference voltage (Vrampend) as described further herein. The sensing of the external capacitor $107_1$ is done via a Kelvin switch $111_1$ rather than from the current DAC 103 output directly. That removes the voltage term $I_{DAC}$×Req1 from the sensed voltage (Vramp), as explained more fully below. Otherwise, the $I_{DAC}$×Req1 will introduce a nonlinear term and result in a small-signal capacitor sensing gain error that depends on the external capacitance (Cext) value.

Current source 121 charges a reference capacitor Cref 123 and the comparator 116 receives the voltage across the reference capacitor. The comparator 116 compares the voltage across the reference capacitance as it ramps up to Vrampend and triggers the rising edge of the signal 152 when the input coupled to the reference capacitance reaches Vrampend. At that point the output of comparator 114 is latched in storage element 120 by the rising edge of signal 152. The updated single bit output dout is supplied to control logic 125 to update the IDAC_code so that the current source 103 is valid for next compare operation. The control logic 125 may be implemented, e.g., using a programmed microcontroller and include memory and software necessary to provide, together with the microcontroller, the control functionality described herein. In other embodiments, the control logic may be implemented as part of other programmable logic devices such as an application specific integrated circuit (ASIC), or other logic. The control logic increases or decreases the current by supplying an IDAC code 127 based on the compare indication. The current IDAc from the current DAC 103 may be adjusted until an appropriate relationship exists between the sensed voltage of the external capacitance and the reference voltage. The external capacitance may be determined as $$C_{ext} = \frac{I_{DAC}}{I_{ref}} \times C_{ref}.$$

The calculation of the external capacitance may be made in the microcontroller providing control logic 125 or in other programmable logic. Further, changes in the capacitance value indicate information about the touch or other physical cause of the change in capacitance.

Figure 2:
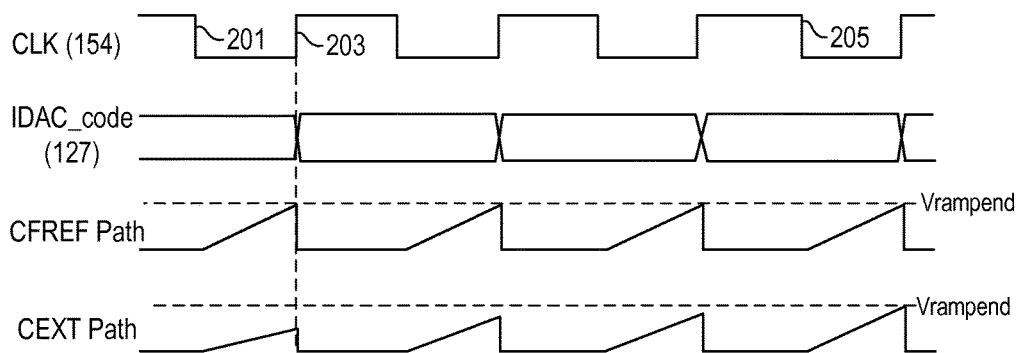
FIG. 2 illustrates a timing diagram illustrating operation of the sensing system of FIG. 1.

FIG. 2 illustrates the operation of the system shown in FIG. 1. The output 152 of the comparator 116 controls the rising edge of CLK signal 154 shown in FIG. 2. A delayed version of the clock signal 154 controls the switches 131, 133, 135, and 155 and thus the charging and discharging of the various capacitors shown in FIG. 1. For ease of illustration, FIG. 2 does not show the delayed version. Other circuits (not shown) control the falling edge of CLK signal 154 and therefore control the width of the high phase of CLK signal 154, which determines the amount of time the capacitors Cref and Cext have to discharge. On the falling edge 201 of the clock signal CLK 154, the IDAC_code supplied by control logic 125 is valid and the current $I_{DAC}$ is supplied to charge the external capacitor (Cext). In addition, the current source 121 starts charging the reference capacitance (Cref) 123 after the falling edge of CLK and the current $I_{DAC}$ charges the external capacitance (Cext). The voltage across the reference capacitance ramps up until it reaches the preset Vrampend, which triggers the rising edge of the signal 152. Responsive to the rising edge, the comparator 114 also compares the voltage across the external capacitance to Vrampend and the compare output is latched in storage element 120 by the signal 152 rising edge and supplied as dout. The updated dout is input to control logic 125 to update the IDAC_code so that the current $I_{DAC}$ from the current DAC 103 is valid for next compare operation. A delayed version of the rising edge of the clock signal CLK 154 at 201 also causes switches 131, 133, 135, and 155 to close. That causes the external capacitor to discharge to ground through switch 131. Discharging through the ground plane is more efficient and simpler as the ground plane can better handle the discharge current from the large external capacitance. In addition, the inputs to the comparator 115 are coupled to a reset voltage (vrst2) 137, which may be different from the ground voltage to which the external capacitors are reset, as explained more fully herein. The reference capacitor 123 is also discharged to ground through switch 155 at this time. The cycle then repeats at the next falling edge of the CLK signal 203. Note that FIG. 2 shows the reference voltage across the reference capacitor ramping to Vrampend on every cycle since the charging current from current source 121 is static. In contrast, the external capacitance voltage gradually increases every cycle in response to a change in the IDAC_code to increase the current $I_{DAC}$ from the current DAC 103 until the voltage across the external capacitance also reaches Vrampend after the cycle started by falling edge 205.

Figure 3:
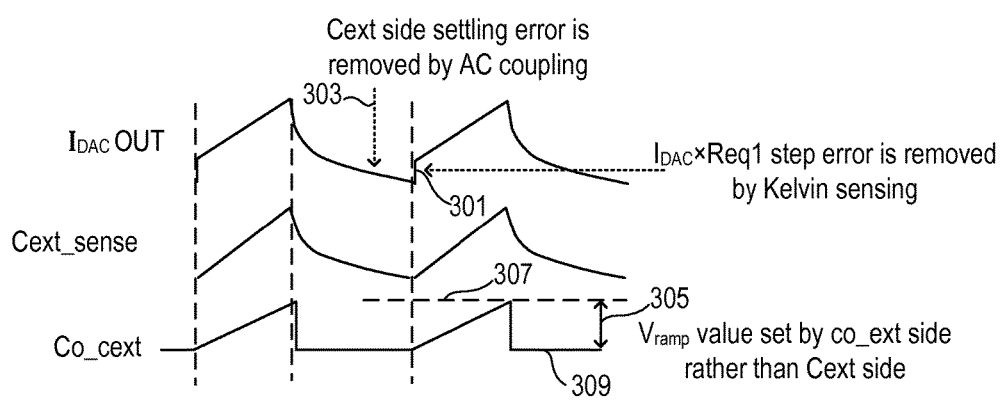
FIG. 3 illustrates advantages provided by the embodiment of FIG. 1 including the use of AC coupling capacitors.

The ramping signal on the external capacitor $107_1$ is AC coupled via a coupling capacitor 141 (Ca1) to the comparator circuit 114. In addition, the reference capacitor is coupled via a matched coupling capacitor 143 (Ca1) to the comparator circuit 116. Therefore, the two paths after the coupling capacitors are better matched than a direct DC coupling would provide. Better matching in the internal Cext and Cref comparison path between the coupling capacitors 141, 143 and the comparator circuits 114 and 116, provides better rejection to common-mode errors and supply perturbation. Consider the equivalent capacitances provided by the AC coupling capacitors. Looking to the left from co_cext node 151 and co_cref node at 153 the equivalent capacitances are, respectively, $$C_{equ1} = \frac{C_{a1} \times C_{ext}}{C_{a1} + C_{ext}} \text{ and } C_{equ2} = \frac{C_{a1} \times C_{ref}}{C_{a1} + C_{ref}},$$

and Ca1<Cref<<Cext. The equivalent capacitances Cequ1 and Cequ2 match considerably better than Cext and Cref. For example, assume Ca1=1 (unit of capacitance), Cref=2, and Cext=32. Assuming those values, Cequ1=0.97 and Cequ2=0.67. The mismatch is improved from a difference of 16× (between 2 and 32 units) to a difference of only about 31% (between 0.97 and 0.67 units). Thus, the better matching in the internal Cext and Cref comparison paths including nodes 151 and 153, provides better rejection to common-mode errors and supply perturbations. Referring to FIG. 3, the diagram illustrates removal of some error sources. For example, by Kelvin sensing (sensing as close to the external capacitor as possible-here the pad), rather than close to the output of the current DAC 103, the voltage shown at 301, due to the current $I_{DAC}$ going through the equivalent resistance Req1 is removed by sensing after the equivalent resistance. Thus, the embodiment of FIG. 1 senses the voltage of the external capacitor after the IR drop caused by $I_{DAC} \times \text{Req}$ by sensing at the pad 105. Note that the path 112 from the pad 105 to the comparator 114 also includes an equivalent resistance Req2 118. However, because there is no current flowing in the sensing path 112, the equivalent resistance Req2 does not introduce an additional voltage drop in the sensing path. FIG. 3 shows at 303 the settling error on the external capacitor side, which is removed by AC coupling capacitor Ca1, which separates the DC bias on either side of the capacitor. FIG. 3 further shows Vramp value 305 is set by the co_cext side rather than Cext side. Vramp=Vrampend (307)−Vrst2 (309) on the comparator side, with Vrampend and Vrst2 set by separate bias circuits. Note also that the Vramp value is insensitive to reset settling errors on the external capacitance side, which saves reset time since Cext>>Ca1 and Cext needs more time to settle well.

Figure 4:
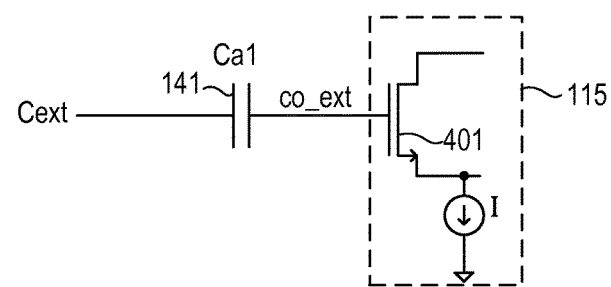
FIG. 4 illustrates an input transistor of the comparator.
Figure 5:
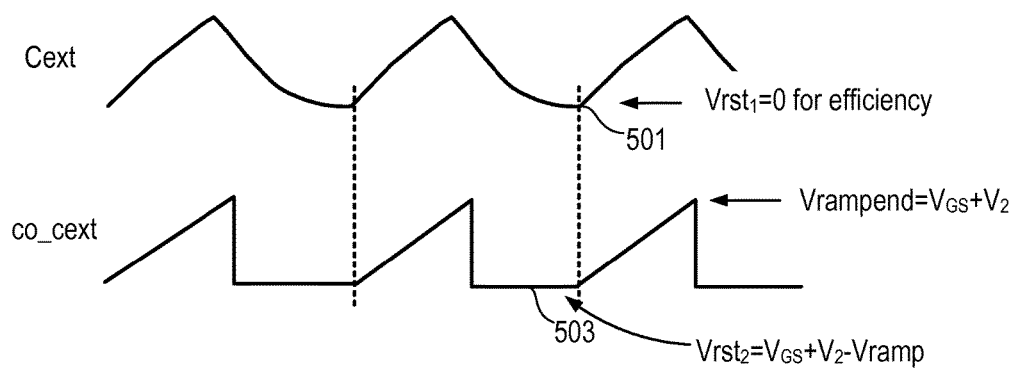
FIG. 5 illustrates that DC bias on the external capacitor side can be different than the DC bias at the input of the comparator circuit.

FIGS. 4 and 5 help illustrate that the DC bias at the external capacitor side Cext and at the comparator input does not need to be the same. Due to the AC coupling capacitor 141, the bias on the comparator side can be set independently to optimize for the comparator input circuits and supply headroom. FIG. 4 shows an input transistor in comparator 114, which is coupled to the external capacitor through the AC coupling capacitor 141. FIG. 5 shows the ramping waveforms for the external capacitor and the ramping waveforms seen on the comparator side of the coupling capacitor 141. For the external capacitor $107_1$ the reset voltage supplied through switch 131 is a ground voltage. The large capacitance of the external capacitor makes it more efficient to reset the external capacitance each cycle to ground (vrst1). However, for vrst2 at node 137, supplied to the input nodes of the comparators 114 and 116, the voltage may be zero volts (ground), or may be set to another voltage.

Referring to FIG. 5, the ramp peak is shown as Vrampend=$V_{GS}+V_2$ where $V_{GS}$ is the gate to source voltage of the input transistor 401 of the comparator 115 shown in FIG. 4. $V_2$ is a voltage set by the desired headroom for the current I on the transistor 401 source node. For example, $V_2$ may be set to 0.5V, 0.25V or some other voltage. The Vramp level and the resulting DC bias Vrst2=$V_{GS}$+V2−Vramp, are picked to provide desired overall circuit headroom in a low supply system. Vrampend and Vrst2 are set by separate bias circuits (not shown in FIG. 1).

While embodiments may support a single external capacitor, other embodiments, such as illustrated in FIG. 1 support multiple external capacitors. Thus, pads 105 including pads $105_1$, $105_2$, $105_N$, are coupled through switches $109_1$, $109_2$, $109_N$ to the current DAC 103. In addition, the AC coupling capacitor 141 is coupled to the pads $105_1$, $105_2$, $105_N$ through switches 111 ($111_1$, $111_2$, $111_N$). Thus, the comparator 114, the control logic 125 and the current DAC 103 may be used for all of the external capacitors 107 ($107_1$, $107_2$, $107_N$). The switches may be set so that only one set of switches is closed at any one time so only one of the capacitors is being sensed at any one time. Control logic may cause the switches to close so that each capacitor is being sensed at a predetermined rate. In other embodiments, all of the switches are closed all the time providing an OR operation and the charging current charges all of the capacitors and the comparator compares the combined voltages across the capacitors. In still other embodiments, one or more sets of switches are closed, but less than all the sets of switches, and the switch settings are static.

Thus, various aspects of a capacitive sensing system have been described. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An apparatus comprising:
    a pad for coupling to an external capacitor;
    a first current source coupled to the pad through a first path, the first current source to supply current to charge the external capacitor; and
    a first comparator coupled to the pad through a second path to compare a first voltage at the pad corresponding to voltage across the external capacitor to a predetermined voltage and provide a first compare indication indicative thereof.

2. The apparatus as recited in claim 1, further comprising:
    a reference capacitor;
    a second comparator to compare a second voltage corresponding to voltage across the reference capacitor and the predetermined voltage and supply a second compare indication; and
    a storage circuit to store the first compare indication responsive to the second compare indication indicating the second voltage has reached the predetermined voltage.

3. The apparatus as recited in claim 1, further comprising:
    a reference capacitor;
    a second comparator to compare a second voltage corresponding to voltage across the reference capacitor and the predetermined voltage and supply a second compare indication;
    a first AC coupling capacitor coupled in series between the pad and the first comparator; and
    a second AC coupling capacitor coupled in series between the reference capacitor and the second comparator.

4. The apparatus as recited in claim 3, further comprising:
    a reset voltage node selectively coupled to a first node between the first AC coupling capacitor and a first input of the first comparator, the first input of the first comparator coupled to the pad; and
    the reset voltage node is selectively coupled to a second node between the second AC coupling capacitor and a first input of the second comparator, the first input of the second comparator coupled to the reference capacitor.

5. The apparatus as recited in claim 4, wherein a first reset voltage selectively coupled to the external capacitor to discharge the external capacitor is different from a second reset voltage selectively coupled to the reset voltage node to thereby provide a different DC bias at the external capacitor and the first input of the first comparator.

6. The apparatus as recited in claim 4, further comprising:
    a first switch to selectively couple the first node to the reset voltage node and a second switch to couple the second node to the reset voltage node;
    a third switch to selectively couple the external capacitor to ground; and
    a fourth switch to selectively couple the reference capacitor to ground.

7. The apparatus as recited in claim 6, further comprising:
    wherein the first, second, third, and fourth switches are coupled to switch according to a clock signal whose rising edge is controlled by the second comparator.

8. The apparatus as recited in claim 1, further comprising:
    a second pad selectively coupled to the first comparator through a third path, the third path including a portion of the second path; and
    a fourth path selectively coupling the second pad to the first current source, the fourth path being separate from the third path.

9. The apparatus as recited in claim 8 further comprising:
    a first switch forming part of the fourth path coupling the second pad to the first current source and a second switch forming part of the third path coupling the second pad to the first comparator.

10. The apparatus as recited in claim 1, further comprising:
    the external capacitor.

11. The apparatus as recited in claim 1, wherein the first current source is a digitally programmable current digital to analog converter (DAC) and control logic for the first current source is responsive to the first compare indication to adjust the current to charge the external capacitor supplied by the current DAC.

12. A method of sensing an external capacitor coupled to a pad of an integrated circuit, comprising:
    supplying a first charging current from a first current source to the pad through a first path to charge the external capacitor coupled to the pad;
    supplying a first voltage across the external capacitor sensed at the pad to a first comparator over a second path, the second path being separate from the first path; and
    comparing the first voltage and a reference voltage in the first comparator and providing a first compare indication indicative of a difference between the first voltage and the reference voltage.

13. The method as recited in claim 12 further comprising:
    charging a reference capacitor to generate a second voltage;

comparing the second voltage to the reference voltage and supplying a second compare indication; and storing the first compare indication responsive to the second compare indication indicating the second voltage has reached the reference voltage.

14. The method as recited in claim 12, further comprising:

charging a reference capacitor to generate a second voltage;

comparing the second voltage to the reference voltage in a second comparator and supplying a second compare indication;

supplying the first voltage to a first input of the first comparator through a first coupling capacitor coupled in series between the pad and the first comparator; and supplying the second voltage to a first input of the second comparator through a second coupling capacitor coupled in series between the reference capacitor and the second comparator.

15. The method as recited in claim 14, further comprising:

selectively coupling a reset voltage to a first node between the first coupling capacitor and the first input of the first comparator; and selectively coupling the reset voltage to a second node between the second coupling capacitor and the first input of the second comparator.

16. The method as recited in claim 15, wherein a first DC bias at the external capacitor is different from a second DC bias at the first input of the first comparator.

17. The method as recited in claim 15, further comprising:

selectively coupling the first node to the reset voltage through a first switch;

selectively coupling the second node to the reset voltage through a second switch;

selectively coupling the external capacitor to ground through a third switch; and selectively coupling the reference capacitor to ground through a fourth switch; and controlling the first, second, third, and fourth switches with a clock signal having a rising edge controlled by the second comparator.

18. The method as recited in claim 12, further comprising:

supplying a second charging current from the first current source to a second pad of the integrated circuit through a third path to charge a second external capacitor coupled to the second pad, the third path including a portion of the second path;

supplying a second voltage indicative of voltage across the second external capacitor to the first comparator over a fourth path that is separate from of the third path; and comparing the reference voltage to the second voltage.

19. The method as recited in claim 12, further comprising adjusting the first charging current according to the first compare indication.

20. An apparatus comprising:

a plurality of pads for coupling to respective external capacitors;

a current digital to analog converter (DAC) selectively coupled to one or more of the pads through a first plurality of switches;

a first comparator having a first input selectively coupled to the pads through a second plurality of switches and having a second input coupled to a reference voltage, the first comparator to compare a first voltage on the first input to the reference voltage and supply a first compare indication;

a second comparator coupled to compare a second voltage across a reference capacitor and the reference voltage and to supply a second compare indication;

a first capacitor coupled in series between the pads and the first input of the first comparator;

a second capacitor coupled in series between the reference capacitor and the second comparator; and a storage circuit to store the first compare indication responsive to the second compare indication indicating the second voltage has reached the reference voltage, an output of the storage circuit being coupled to a control circuit for the current DAC.

* * * * *

UNITED STATES PATENT AND TRADEMARK OFFICE
CERTIFICATE OF CORRECTION

PATENT NO. : 10,041,981 B2
APPLICATION NO. : 14/927959
DATED : August 7, 2018
INVENTOR(S) : Xiaodong Wang It is certified that error appears in the above-identified patent and that said Letters Patent is hereby corrected as shown below:

In the Specification

In Column 3, Line 43, please insert --203-- after "edge";
In Column 3, Line 44, please delete "at 201";
In Column 3, Line 55, please replace "203" with --154--.

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*